(12) United States Patent
Marzaki et al.

(10) Patent No.: US 10,937,746 B2
(45) Date of Patent: Mar. 2, 2021

(54) INTEGRATED ULTRALONG TIME CONSTANT TIME MEASUREMENT DEVICE AND FABRICATION PROCESS

(71) Applicant: STMicroelectronics (Rousset) SAS, Rousset (FR)

(72) Inventors: Abderrezak Marzaki, Aix en Provence (FR); Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/549,000

(22) Filed: Aug. 23, 2019

(65) Prior Publication Data
US 2020/0075506 A1  Mar. 5, 2020

(30) Foreign Application Priority Data
Aug. 31, 2018  (FR) ...................... 1857842

(51) Int. Cl.
| | |
|---|---|
| *H01L 27/08* | (2006.01) |
| *H01L 23/00* | (2006.01) |
| *G04F 1/00* | (2006.01) |
| *H01L 21/70* | (2006.01) |
| *H01L 27/01* | (2006.01) |
| *H01L 27/10* | (2006.01) |

(52) U.S. Cl.
CPC ............ *H01L 23/573* (2013.01); *G04F 1/005* (2013.01); *H01L 21/705* (2013.01); *H01L 27/013* (2013.01); *H01L 27/101* (2013.01)

(58) Field of Classification Search
CPC .... H01L 27/101; H01L 27/0805; H01L 28/40
See application file for complete search history.

(56) References Cited

U.S. PATENT DOCUMENTS

| | | | | | |
|---|---|---|---|---|---|
| 4,266,144 | A | * | 5/1981 | Bristol | ............... H03K 17/9622 |
| | | | | | 307/116 |
| 5,438,541 | A | * | 8/1995 | Ando | ................ H01L 27/10805 |
| | | | | | 365/182 |
| 5,483,482 | A | * | 1/1996 | Yamada | .................. G11C 11/34 |
| | | | | | 365/175 |

(Continued)

FOREIGN PATENT DOCUMENTS

| | | |
|---|---|---|
| EP | 2693440 A1 | 2/2014 |
| FR | 2981190 A1 | 4/2013 |
| WO | 02056370 A1 | 7/2002 |

OTHER PUBLICATIONS

INPI Search Report and Written Opinion for FR 1857842 dated May 24, 2019 (9 pages).

*Primary Examiner* — Michele Fan
(74) *Attorney, Agent, or Firm* — Crowe & Dunlevy

(57) ABSTRACT

An ultralong time constant time measurement device includes elementary capacitive elements that are connected in series. Each elementary capacitive element is formed by a stack of a first conductive region, a dielectric layer having a thickness suited for allowing charge to flow by direct tunneling effect, and a second conductive region. The first conductive region is housed in a trench extending from a front face of a semiconductor substrate down into the semiconductor substrate. The dielectric layer rests on the first face of the semiconductor substrate and in particular on a portion of the first conductive region in the trench. The second conductive region rests on the dielectric layer.

11 Claims, 3 Drawing Sheets

(56) References Cited

U.S. PATENT DOCUMENTS

| | | | | |
|---|---|---|---|---|
| 7,460,441 | B2* | 12/2008 | Bartling | G01R 31/31727 368/118 |
| 8,076,707 | B1* | 12/2011 | Hyde | H01L 29/7883 257/314 |
| 8,872,177 | B2 | 10/2014 | La Rosa et al. | |
| 8,963,574 | B2* | 2/2015 | La Rosa | G11C 5/06 324/764.01 |
| 9,870,489 | B2* | 1/2018 | Modave | G06F 21/85 |
| 2002/0102810 | A1* | 8/2002 | Iizuka | H01L 21/02178 438/396 |
| 2003/0098706 | A1* | 5/2003 | Schroeder | H01L 22/34 257/296 |
| 2005/0018380 | A1* | 1/2005 | Yeo | H01L 28/40 361/306.1 |
| 2007/0145981 | A1* | 6/2007 | Tomita | G01R 31/3008 324/509 |
| 2007/0257295 | A1* | 11/2007 | Miki | H01L 27/10852 257/310 |
| 2008/0309396 | A1* | 12/2008 | Lee | G06F 21/73 327/509 |
| 2010/0020648 | A1* | 1/2010 | La Rosa | G11C 27/024 368/107 |
| 2010/0027334 | A1* | 2/2010 | La Rosa | G11C 16/26 365/185.05 |
| 2010/0181606 | A1* | 7/2010 | Takaishi | H01L 29/66666 257/300 |
| 2010/0214014 | A1* | 8/2010 | Dennard | G11C 5/145 327/541 |
| 2015/0187865 | A1* | 7/2015 | Barabash | H01L 29/94 257/532 |

* cited by examiner

INTEGRATED ULTRALONG TIME CONSTANT TIME MEASUREMENT DEVICE AND FABRICATION PROCESS

PRIORITY CLAIM

This application claims the priority benefit of French Application for Patent No. 1857842, filed on Aug. 31, 2018, the content of which is hereby incorporated by reference in its entirety to the maximum extent allowable by law.

TECHNICAL FIELD

Embodiments and implementations relate in general to integrated circuits and more particularly to the production of an ultralong time constant time measurement device.

BACKGROUND

Ultralong time constant (ULTC) time measurement circuits are qualified to make measurements with an application range on the order of tens of minutes to several hours.

In a number of applications it is desirable to have information that is representative of a time elapsed between two events, whether it be a precise or approximate measurement thereof.

One example of an application relates to fraud prevention measures, in which a system is locked for long enough for it to be a deterrent. These preventative measures apply to semi-invasive attacks, such as for example analysis techniques employing fault injection, or to non-invasive attacks, such as brute force attacks or side channel attacks. In general, this type of attack is based on self-learning methods implementing numerous repeated iterations and precise synchronizations.

In this context, locking the system for a duration of the order of an hour or of a few tens of minutes is enough to deter a fraudulent party from employing such an approach.

This type of prevention by locking the system has the advantage of being temporary and non-destructive, for example in the case of a malfunction or an operating error being detected as a fraud attempt.

Of course, it is desirable for the deactivation of the system not to disrupt the operation of measuring the duration of the lock.

An electronic device has already been proposed, for example in U.S. Pat. No. 8,872,177 (see also FR 2981190 A1), incorporated by reference, in which the time elapsed between two events is determined by measuring the residual charge of a capacitive storage element that has been charged beforehand, which is connected to a series of charge flow capacitive elements featuring leakages in their dielectric spaces. The residual charge of the capacitive storage element is representative of the time elapsed during discharging.

According to the teaching of U.S. Pat. No. 8,872,177, the dielectric spaces of the capacitive elements include a thick dielectric layer that does not leak and leaky regions that are thinner, allowing charge to leak out by tunneling effect, and are thus produced with a view to controlling the dimensions of said leaky regions.

One drawback is that, in practice, the leaky regions are surrounded by a thicker dielectric layer, in particular a silicon ONO (oxide-nitride-oxide) layer, which uses a non-negligible gross substrate area and imposes high-granularity design rules, i.e. the minimum dimensions thereof are relatively large and the embodiments thereof are bulky.

However, it is desirable to decrease the footprint of integrated circuits.

There is accordingly a need for ultralong time constant time measurement devices and measures that are capable of measuring a passage of time of the order of a few tens of minutes to several days, without requiring a power supply, substantially independently of temperature, and furthermore having a minimized footprint.

SUMMARY

According to one aspect, what is proposed is an integrated ultralong time constant time measurement device, comprising a plurality of elementary capacitive elements in series, a capacitive storage element that is connected to one end of the series of elementary capacitive elements and is capable of being charged, the series of elementary capacitive elements being configured to discharge the charged capacitive storage element and to deliver, to at least one node of the series, a physical quantity that is representative of the discharging of the capacitive storage element and of a duration that has elapsed between the start of an operation of discharging the capacitive storage element and the time at which the physical quantity is delivered, wherein each elementary capacitive element comprises a stack of a first conductive region, of a dielectric layer, the thickness of which is suitable for allowing charge to flow by direct tunneling effect, and a second conductive region, wherein the first conductive region is housed in a trench extending from a front face of a semiconductor substrate down into the substrate while the dielectric layer rests on the front face of the substrate and the second conductive region rests on the dielectric layer.

Thus, since the entire interface of the dielectric layer located between the two conductive regions has a thickness that is suitable for allowing charge to circulate by direct tunneling effect, no gross loss of area is caused by such an embodiment. Specifically, an area that is 3.5 times smaller with respect to a reference ultralong time constant time measurement device technology, mentioned above, has been obtained.

Furthermore, it is actually advantageous to measure a quantity that is representative of the discharging of the capacitive storage element at a point of at least one node of the series of elementary capacitive elements rather than directly at the terminals of the capacitive storage element.

According to one embodiment, said stack of the first conductive region, of the dielectric layer and of the second conductive region of each elementary capacitive element is located facing a portion of said trench housing the first conductive region on said front face.

This allows the use of the area to be optimized.

According to one embodiment, the elementary capacitive elements are electrically connected to one another in series, alternately either by a second conductive region that is common to two consecutive elementary capacitive elements or by a first conductive region that is common to two consecutive elementary capacitive elements.

This allows the use of the area to be optimized.

According to one embodiment in which the semiconductor substrate comprises an electrical isolation region extending vertically into the substrate from the front face, said trench housing the first conductive region of each elementary capacitive element passes through the electrical isolation region.

This makes it possible for example to prevent current leakages into the substrate without providing another thickness of dielectric facing the substrate for this purpose.

According to one embodiment, the plurality of elementary capacitive elements in series is located in a semiconductor well that is housed in the substrate and includes a first contact and a second contact, which contacts are electrically connected by an electrical path through the well comprising a section that is located between the bottom of a trench and the bottom of the well, and the device further includes a detection circuit that is configured to detect an electrical discontinuity in the well between the first contact and the second contact.

Thus, in the event that an electrical discontinuity in the well between the first contact and the second contact is detected, which would be representative of the substrate being etched from the back face, the detection circuit will be able for example to order a preventative or destructive countermeasure against this etch.

What is proposed is a method for measuring a duration, comprising an operation of charging the capacitive storage element of a device such as defined above, an operation of discharging the charged capacitive storage element through the series of elementary capacitive elements and obtaining, on at least one node of the series of elementary capacitive elements, said physical quantity that is representative of the discharging of the capacitive storage element and of said duration that has elapsed between the start of an operation of discharging the capacitive storage element and the time at which the physical quantity is obtained.

According to another aspect, what is proposed is a process for fabricating an integrated ultralong time constant time measurement device, comprising an operation of forming trenches extending from a front face of a semiconductor substrate down into the substrate; an operation of forming first conductive regions that are housed in said trenches; an operation of forming dielectric layers resting on the front face, the thicknesses of which are suitable for allowing charge to flow by direct tunneling effect; an operation of forming second conductive regions resting on said dielectric layers, the respective stacks of a first conductive region, of a dielectric layer and of a second conductive region forming a plurality of elementary capacitive elements in series, the process further comprising an operation of forming a capacitive storage element that is connected to one end of the series of elementary capacitive elements.

According to one implementation, the operations of forming the dielectric layers and the second conductive regions are located facing respective portions of the width of said trenches housing the first conductive regions on said front face.

According to one implementation, said operations of forming the trenches and the respective first conductive regions and said operations of forming the dielectric layers and the respective second conductive regions are positioned relatively so as to form the plurality of elementary capacitive elements that are electrically connected to one another in series, alternately either by a second conductive region that is common to two consecutive elementary capacitive elements or by a first conductive region that is common to two consecutive elementary capacitive elements.

According to one implementation, the process comprises an operation of forming an electrical isolation region extending vertically into the substrate from the front face, and said operation of forming the trenches housing the first conductive regions is implemented through the electrical isolation region.

According to one implementation, the process comprises a prior operation of forming a semiconductor well in the substrate and an operation of forming a first contact and a second contact, which contacts are electrically connected by an electrical path through the well comprising a section that is located between the bottom of a trench and the bottom of the well, and the process further comprises an operation of detecting an electrical discontinuity in the well between the first contact and the second contact.

BRIEF DESCRIPTION OF THE DRAWINGS

Other advantages and features of the invention will become apparent on examining the detailed description of wholly non-limiting embodiments and modes of implementation, and the appended drawings in which.

DETAILED DESCRIPTION

Figure 1:
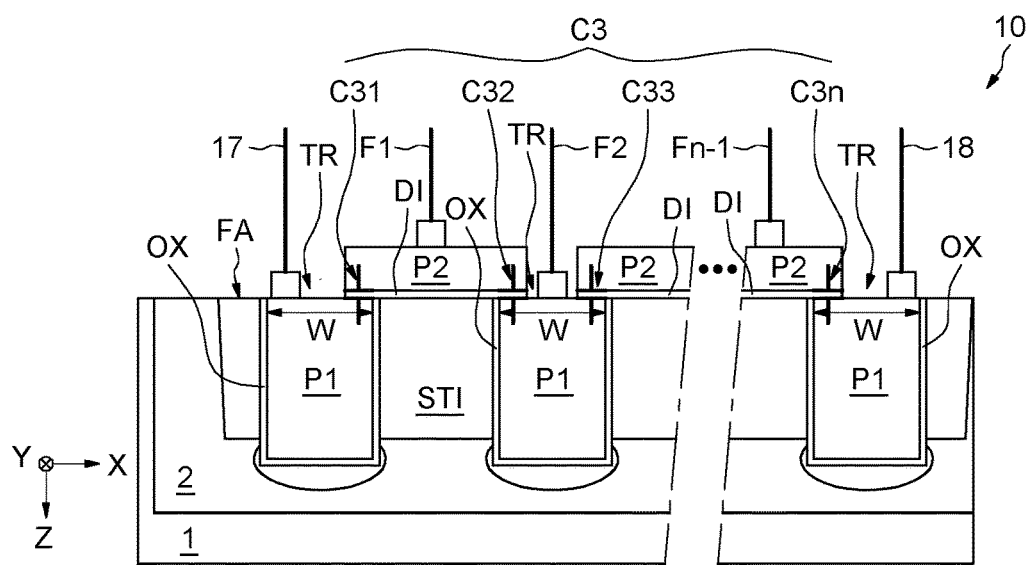
FIG. 1 illustrates an embodiment of an ultralong time constant time measurement device.

FIG. 1 shows an example of one embodiment of an ultralong time constant time measurement device 10.

The device 10 belongs to an integrated circuit produced on a semiconductor substrate 1, for example a p-doped silicon substrate. In this depiction, the device 10 is formed in a portion of the substrate 1 that is doped with the conductivity type opposite that of the rest of the substrate. This doped portion forms a semiconductor well 2, namely a single well; that being so, it is possible that reference will be made hereinafter to the term "substrate" in order to refer to a portion that is located in the well 2, in particular with respect to the electrical isolation regions STI and the trenches TR.

An orthonormal coordinate system orients FIG. 1 in a vertical direction Z, a horizontal direction X and a direction Y that is perpendicular to the sectional plane (XZ) of the figure.

The device 10 comprises a plurality of elementary capacitive elements C31, C32, C33, . . . , C3n, which are electrically connected in series.

Each elementary capacitive element C31-C3n comprises a stack of a first conductive region P1, of a dielectric layer DI and of a second conductive region P2. For example, the first conductive regions P1 and the second conductive regions P2 may be formed of conductive polycrystalline silicon and the dielectric layers DI made of silicon oxide. The thickness of the dielectric layer DI is suitable, in particular according to the permittivity of the material used, for allowing charge to circulate by direct tunneling effect, in particular in the conditions described below with reference to FIG. 2.

In each elementary capacitive element C31-C3n, the first conductive region P1 is housed in a trench TR. Each trench TR extends from a front face FA of the semiconductor substrate down (in the Z direction) into the substrate while the dielectric layer DI rests on the front face FA of the substrate and the second conductive region P2 rests on the dielectric layer DI.

In this depiction, the front face FA is located in a plane XY.

Each trench TR includes here an insulating envelope OX on its flanks and its bottom.

Unlike in conventional technologies, such an embodiment may be obtained by following design rules for logic portions of integrated circuits, which limit for example the width of a strip of second conductive regions P2 to 0.04 µm and the spacing between two such strips to 0.10 µm, and the width of a trench TR to 0.11 µm and the spacing between two trenches to 0.11 µm. According to these design rules, the area of an embodiment of an elementary capacitive element is smaller than 0.1 µm², which may represent an area that is 3.5 times smaller than the area of an elementary capacitive element based on conventional technologies.

In the example shown in FIG. 1, the stack of the first conductive region P1, of the dielectric layer DI and of the second conductive region P2 of each elementary capacitive element C31-C3n is located facing a portion of the width of the trench TR housing the first conductive region P1. The width W of the "exposed" surface of the first conductive region P1 located on the front face FA is meant here. Specifically, the dielectric layer and the second conductive region P2 are stacked on peripheral portions in the direction X of the width W, at the surface of the first conductive regions P1.

This allows, in this example, said plurality of elementary capacitive elements to be electrically connected to one another in series while optimizing the amount of area that is consumed. The elementary capacitive elements are connected alternately either by a second conductive region P2 that is common to two consecutive elementary capacitive elements C3$i$-1, C3$i$ (where i is an integer such that 2≤i≤n−1) or by a first conductive region P1 that is common to two consecutive elementary capacitive elements C3$i$, C3$i$+1 (where i is an integer such that 2≤i≤n−1).

Specifically, the elementary capacitive element C31 is connected in series with the elementary capacitive element C32 directly via the second conductive region P2 which is common thereto, i.e. here the region P2 that is provided with a contact node F1. Next, the elementary capacitive element C32 is connected in series with the elementary capacitive element C33 directly via the first conductive region P1 which is common thereto, i.e. the region P1 that is provided with a contact node F2. The consecutive elementary capacitive elements are connected to one another in this manner via a common second conductive region P2 or first conductive region P1. Each node of the series, between two consecutive elementary capacitive elements C3$j$, C3$j$+1 (where j is an integer such that 1≤j≤n−1), comprises here a contact node Fj that is intended to deliver measurements of the charge of the elementary capacitive elements C31-C3n.

It is possible to envisage a configuration in which the stack of the first conductive region P1, of the dielectric layer DI and of the second conductive region P2 of each elementary capacitive element C31-C3n is located facing the entire width W, in the direction X, of the trench TR at the surface of the first conductive regions P1. Thus, the analogous stack of the next elementary capacitive element is offset along the direction Y on the same first conductive region P1. For example, this configuration defines a course taking the shape of crenulations, or of steps, or taking any other shape, when viewed from above in the plane XY.

The elementary capacitive elements C31-C3n connected to one another in this way form a series C3 of capacitive elements, also referred to as a "flow element C3". A first contact node 17 is formed at one end of the series C3 and a second contact node 18 is formed at the other end of the series C3.

What is meant by "producing a contact node" is for example the metal silicidation of a silicon film allowing ohmic coupling to be applied thereto.

Furthermore, in this embodiment, the semiconductor substrate 1 comprises an electrical isolation region STI extending vertically (in the Z direction) into the substrate from the front face FA. The electrical isolation region STI is for example a shallow trench isolation. Thus, the trench TR housing the first conductive region P1 of each elementary capacitive element passes through the electrical isolation region STI.

The trenches TR extend vertically down into the substrate 1 further than the electrical isolation regions STI. Thus, the isolating envelope OX may for example be located only on the portion of the flanks of the trench TR that is located facing the substrate 1.

Figure 2:
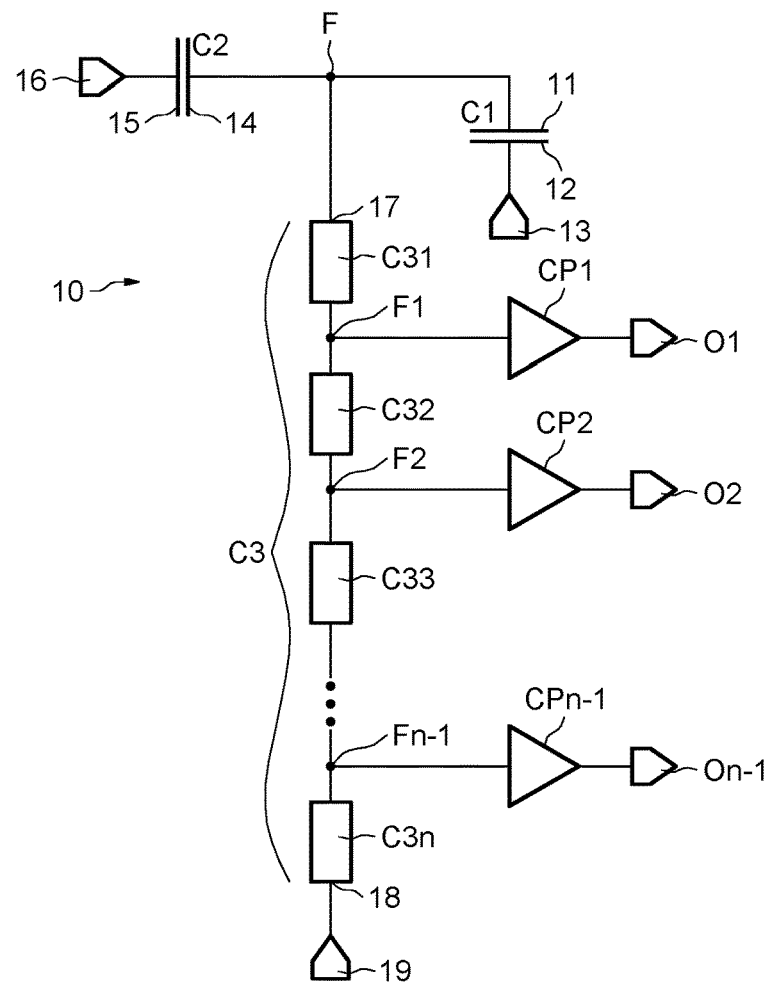
FIG. 2 is a circuit diagram of an application of the embodiment shown in FIG. 1.

FIG. 2 is a circuit diagram of one application of the device 10 described above with reference to FIG. 1, the references that are common to FIGS. 1 and 2 denoting the same elements.

The device 10 further comprises in particular a capacitive storage element C1 that is capable of being charged and being connected to the first end 17 of the series C3 of elementary capacitive elements. This series C3 of elementary capacitive elements is configured to discharge the charged capacitive storage element C1 and to deliver, to at least one node F1-Fn−1 of the series C3, a measurement that is representative of the discharging of the capacitive storage element C1.

The device 10 thus comprises a first capacitive element C1, a first electrode 11 of which is connected to a floating node F and a second electrode 12 of which is connected to a terminal 13 for applying a potential. The device 10 also includes a second capacitive element C2, a first electrode 14 of which is connected to the node F and a second electrode 15 of which is connected to a terminal 16 for applying a potential.

The circuit 10 comprises the series C3 of elementary capacitive elements C31, C32, C33, . . . , C3n, the first node 17 of which, at one end of the series C3, is connected to the node F, and the second node 18 of which, at the other end of the series C3, is connected to a terminal 19 for applying a potential. The dielectric space of each elementary capacitive element C31-C3n is designed, by virtue of its permittivity and/or by virtue of its thickness, to exhibit non-negligible leakages over time. The capacitive element C1 has a charge-holding capacity that is higher than the equivalent capacity of the series C3 and the capacitive element C2 has a charge-holding capacity that is higher than that of the series C3 but lower than that of the element C1.

The inventors have observed that when elementary capacitive elements are connected in series, the resistance seen by the electric charge, when leaking by tunneling effect, increases in proportion to the number of elementary capacitive elements, resulting in an exponential decrease in the speed at which the storage element C1 is discharged. One role of the capacitive element C1 (storage element) is to store electric charge.

One role of the series C3 of elementary capacitive elements C31-C3n (flow element) is to discharge the storage element C1 relatively slowly with respect to a direct connection of its electrode 11 to ground. One role of the capacitive element C2 is to allow charge to be injected into the capacitive element C1 while avoiding the stress that would result, for the flow element C3, from directly charging the storage element C1 by applying a supply voltage between the node F and the terminal 13.

In a step of initializing a charge-holding phase, the terminals 13 and 19 are at a reference potential, for example ground potential. A high supply potential (positive with respect to ground) is applied to the terminal 16, resulting in the capacitive element C1 charging.

As a variant, in order to charge the element C1, the terminal 19 may be grounded, and the terminals 16 and 13 placed at potentials that are positive and negative, respectively, in relation to ground.

When the supply voltage is no longer being applied between the terminals 16 and 13, for example when the circuit is no longer being supplied with power, the storage element C1 is discharged in a controlled manner (relatively slowly) through the flow element C3. It will be noted that a controlled discharge phase may also be provided when the circuit is still being supplied with power.

During the discharge phase, the terminals 13, 16 and 19 may be left floating, or placed at one and the same reference potential, for example ground potential.

In a read step, after a discharge phase, the residual charge of the storage element C1 is measured (for the measurement operation the device must be supplied with power). The residual charge of the element C1 is considered to be representative of the time elapsed between the end of the initialization step and the read step.

A reinitialization (reset) step may, if necessary, be provided in order to completely discharge the storage element C1 through the capacitive element C2. For this, the terminals 19 and 16 may be grounded and the terminal 13 placed at a high supply potential. As a variant, the terminal 19 may be grounded, and the terminals 13 and 16 placed at potentials that are positive and negative, respectively, in relation to ground.

It is also possible to provide an accelerated controlled discharge phase for discharging the storage element C1 (through the flow element C3), for example for the purpose of testing the time measurement circuit. For this, the terminal 19 may be grounded, and the terminals 13 and 16 may be biased at one and the same potential that is positive with respect to the ground, for example a potential that is between the ground potential and the high supply potential.

In the example of FIG. 2, a plurality of comparators $CP_j$, where j is an integer such that $1 \leq j \leq n-1$, are connected to intermediate nodes $F_j$ of the flow element C3. In a read phase, each comparator $CP_j$ receives, as input, the potential of the node $F_j$ that is common to the capacitive elements $C3_j$ and $C3_{j+1}$ and compares this potential with a threshold. In one embodiment example, one and the same comparison threshold is set for all of the comparators, for example a threshold that is lower than the potential taken by the node $F_{n-1}$ when the storage element C1 is charged. Each comparator $CP_j$ delivers binary information over an output terminal $O_j$. As the storage element C1 is discharged, the comparators will switch one after the other, starting with the comparator $CP_{n-1}$. The binary word formed by the set of binary information available over the terminals $O_j$ (n−1 bits) provides information relating to the state of charge of the storage element C1, and hence to the time elapsed from the start of the discharge phase of the element C1. This measurement circuit has the advantage of being of simple design with respect to a circuit for measuring residual charge that is directly connected to the terminals of the element C1.

In order for the circuit 10 to operate properly, the node F and the intermediate nodes $F_j$ are preferably floating nodes, i.e. nodes that are separated, by a dielectric space, from any terminal applying a potential, rather than being directly connected to an unisolated region of the semiconductor substrate of the chip (in which case leakages into the substrate could dominate with respect to leakages through the flow element C3).

As an embodiment example, the dielectric spaces of the various capacitive elements C1, C2, C3 may be formed of silicon oxide. In this example, the thickness of the dielectric layer of the capacitive storage element C1 may be between 150 and 200 Å, the thickness of the dielectric layer of the capacitive element C2 may be between 70 and 100 Å and the thickness of the dielectric layers of the elementary capacitive charge-flow elements $C3_1$-$C3_n$ may be of the order of 20 Å.

In any case, by virtue of the thicknesses of dielectric that are used, the capacitive elements C1 and C2 exhibit parasitic leakages (leakages through their dielectric spaces) that are negligible with respect to the flow element C3.

Figure 3:
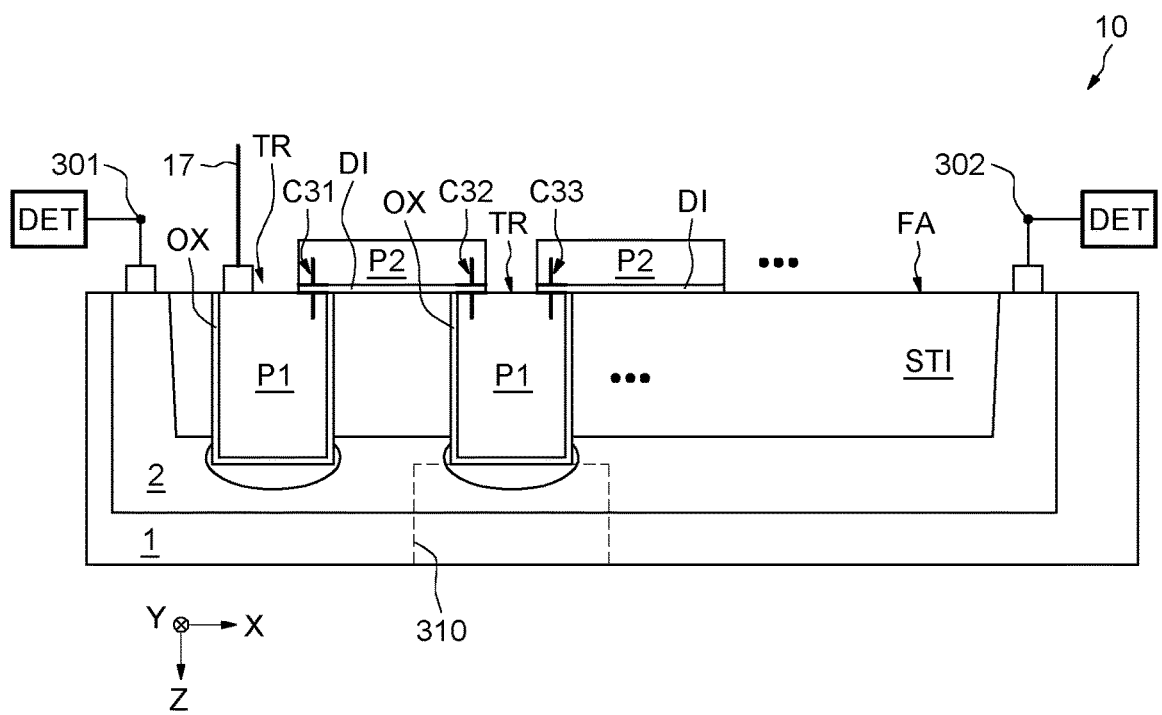
FIGS. 3 and 4 show variants of an ultralong time constant time measurement device that includes a detection circuit configured to detect an electrical discontinuity.
Figure 4:
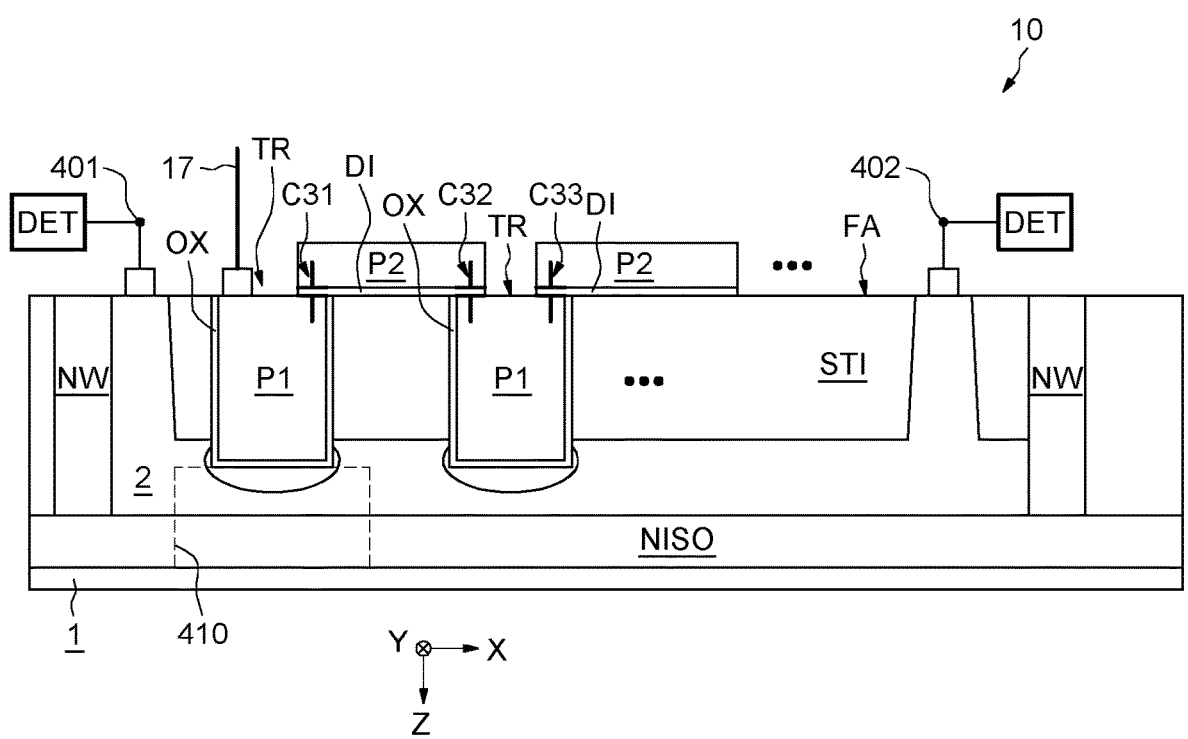

FIGS. 3 and 4 show two variants of one embodiment example, in which the ultralong time constant time measurement device 10 includes a detection circuit DET that is configured to detect an electrical discontinuity in the well 2 between a first contact 301/401 and a second contact 302/402.

Specifically, since the time measurement device may be intended for the prevention of fraud attempts by reverse engineering, such as attempts to retrieve proprietary information, this embodiment example adds additional protection to the device, for example in the event that a fraudulent party had detected this time measurement device and had grounded the structure so that it would discharge instantaneously.

In this embodiment, the device 10 is located in a semiconductor well 2 that is housed in the semiconductor substrate 1.

In the variant of FIG. 3, the semiconductor well 2 is a single well, i.e. a well having a conductivity type that is the opposite of the conductivity type of the semiconductor substrate 1. The well 2 and the substrate 1 are thus electrically separated by a p-n junction that defines in particular the bottom of the well 2.

In the variant of FIG. 4, the semiconductor well 2 is a triple well, i.e. a well having a conductivity type that is the same as the conductivity type of the semiconductor substrate 1, for example p-type conductivity. The well 2 and the substrate 1 are electrically separated vertically by a buried semiconductor layer NISO of the opposite conductivity type, for example n-type conductivity, and laterally by semiconductor shafts NW that are also of the opposite conductivity type. Thus, p-n and n-p (or n-p and p-n according to entirely inverse conductivity types) junctions allow the well 2 and the substrate 1 to be electrically isolated for positive and negative biases. The p-n junction between the well 2 and the buried semiconductor region 5 defines the bottom of the well 2.

In both variants, the semiconductor well 2 includes a first contact 301/401 and a second contact 302/402 that are electrically connected by an electrical path through the well 2. The electrical path passes between the bottom of the trenches TR housing the first conductive regions P1 and the bottom of the respective well 2. The electrical path therefore comprises a section that is located between the bottom of said trenches TR and the bottom of the well 2.

If an etch 310/410 from the back face of the substrate 1 is carried out down to the vicinity of the bottom of the trenches TR, the electrical path will be broken. Measuring the continuity between the first contact 301/401 and the second contact 302/402 thus allows such an etch 310/410 to be detected easily.

To this end, the detection circuit DET is configured to measure the continuity between the first contact 301/401 and the second contact 302/102. The detection circuit DET is thus able to generate a discontinuity-revealing signal, for example when an attack from the back face is carried out.

The discontinuity-revealing signal could for example be used to trigger countermeasure means for guarding against such an attack.

Figure 5:
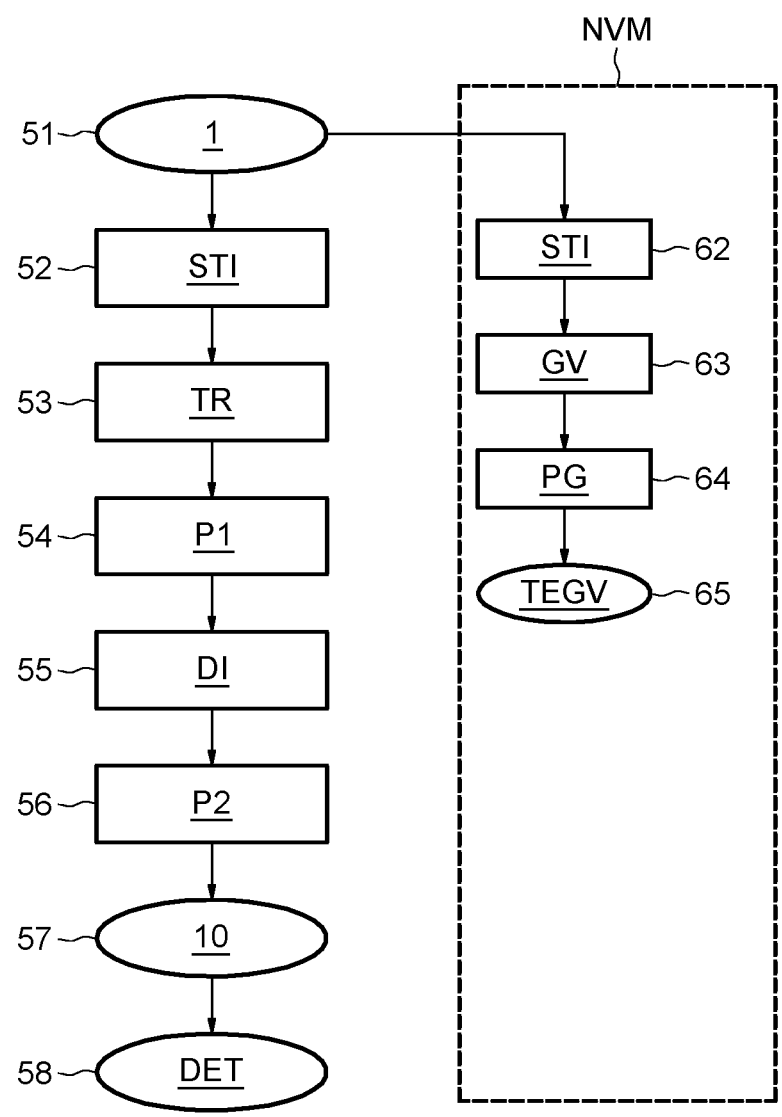
FIG. 5 shows fabrication steps for making a time measurement device such as shown in FIGS. 1 to 4.

FIG. 5 schematically shows fabrication steps for a time measurement device such as described above with reference to FIGS. 1 to 4.

In an initial step 51, wells 2 for example have been prepared in a semiconductor substrate 1 having a front face FA.

A step 52 comprises an operation of forming an electrical isolation region STI extending vertically into the substrate 1 from the front face FA. For example, this step is implemented according to a process for forming shallow trench isolations.

A step 53 comprises an operation of forming trenches TR extending from a front face FA of the semiconductor substrate down into the substrate 1. The operation of forming the trenches TR is implemented through the electrical isolation region STI.

Step 53 may comprise a dry etch for etching the trenches TR in the well 2 of the substrate 1. The design rules governing this etch 53 may for example define a minimum width of 0.11 μm for a trench and a minimum spacing of 0.11 μm between two trenches.

Step 53 may further comprise an operation of forming an insulating envelope OX at least on the portions of the bottom and of the flanks of the trench that are surrounded by the well 2.

A step 54 comprises an operation of forming first conductive regions P1 that are housed in said trenches TR. The operation of forming the first conductive region P1 may comprise an operation of depositing polycrystalline silicon, followed by a chemical-mechanical polishing operation in order to remove excess material beyond the level of the front face FA.

A step 55 comprises an operation of forming the dielectric layers DI resting on the front face FA, in particular on a portion that is located facing respective portions of the surface of the first conductive regions P1 on the front face FA.

The thicknesses of the dielectric layers DI are suitable for allowing charge to flow by direct tunneling effect; for example, the operation of forming the dielectric layer DI may comprise an operation of partially or completely growing an oxide layer for an MOS transistor gate that is intended for use in logic operations.

A step 56 comprises an operation of forming second conductive regions P2 resting on said dielectric layers DI. The operation of forming the second conductive layer P2 may also comprise an operation of depositing polycrystalline silicon followed by a dry etch (for example the same etch as that used to define the MOS transistors intended for use in logic operations). The design rules governing this operation 53 may for example define a minimum width of 0.04 μm for a strip of a second conductive region P2 and a minimum spacing of 0.10 μm between two strips.

The respective stacks of a first conductive region P1, of a dielectric layer DI and of a second conductive region P2 are formed so as to obtain a plurality of elementary capacitive elements C31-C3$n$ that are electrically connected in series.

To this end, steps 53, 54, 55 and 56 may be arranged with respect to one another so as to form a plurality of elementary capacitive elements C31-C3$n$ that are electrically connected to one another in series, alternately either by a second conductive region P2 that is common to two consecutive elementary capacitive elements or by a first conductive region P1 that is common to two consecutive elementary capacitive elements.

A step 57 further comprising an operation of forming a capacitive storage element C1 that is capable of being charged and being connected to a first end 17 of the series C3 of elementary capacitive elements thus allows an ultralong time constant time measurement device 10 of the type of that described above with reference to FIG. 2 to be obtained.

In operation, discharging the previously charged capacitive storage element C1 through the series C3 of elementary capacitive elements and providing a measurement that is representative of the discharging of the capacitive storage element C1 on at least one node F1-F$n$−1 of the series C3 allows a timespan of the order of a few tens of minutes to several days to be measured.

Furthermore, the process may also comprise a prior operation, for example in step 51, of forming a semiconductor well 2 in the substrate 1 and an operation of forming, in the well 2, a first contact 301, 401 and a second contact 302, 402 that are electrically connected by an electrical path comprising a section that is located between the bottom of a trench TR and the bottom of the well 2. Thus, a step 58 may comprise an operation DET of detecting an electrical discontinuity in the well 2 between the first contact 301/401 and the second contact 302/402 may allow an attack by etching the integrated circuit from the back face to be revealed.

Advantageously, the process may be implemented at the same time as a process for fabricating a buried vertical-gate transistor, for example one belonging to a memory cell of a non-volatile memory. Of course, this implementation is advantageous in the case that the integrated circuit is intended to include a buried vertical-gate transistor, the process described above with reference to steps 51 to 58 being capable of being implemented independently.

In a non-volatile memory NVM portion of one and the same substrate 1 that was prepared in the initial step 51, isolation regions STI are produced in a step 62 at the same time as step 52.

A step 63, carried out at the same time as step 53, comprises an operation of forming a vertical gate GV trench, intended to house a conductive vertical gate region P1, extending from the first face (4) of the substrate 1 down into the substrate 1. Step 63 comprises an operation of forming a dielectric envelope on the bottom and the flanks of the vertical gate GV trench.

A step 64, carried out at the same time as step 54, comprises an operation of forming a conductive gate region PG that is housed in said vertical gate GV trench.

A buried vertical-gate transistor TEGV is thus obtained in a step 65, upon completion in particular of upstream or downstream steps of implanting a drain region at the site of the front face 4 of the substrate 1, at the edge of the vertical gate GV, and of an operation of forming a buried source region in the well 2, at the bottom of the vertical gate GV trench.

Furthermore, the invention is not limited to these embodiments but encompasses all variants thereof; for example, it would be possible to envisage using a charge flow device of the proposed type in any circuit suitable for holding electric charge in order to measure time, other than that described with reference to FIG. 2.

The invention claimed is:

1. An ultralong time constant time measurement device, comprising:
   a plurality of elementary capacitive elements connected in a series;
   a capacitive storage element that is connected to one end of the series connected plurality of elementary capacitive elements and is configured to be charged;
   wherein the series connected plurality of elementary capacitive elements is configured to discharge the charged capacitive storage element and to deliver, to at least one node of the series connected plurality of elementary capacitive elements, a physical quantity that is representative of the discharging of the capacitive storage element and a duration that has elapsed between a start of an operation of discharging the capacitive storage element and a time at which the physical quantity is delivered;
   wherein each elementary capacitive element comprises:
      a stack of a first conductive region, a dielectric layer having a thickness that allows charge to flow by direct tunneling effect and a second conductive region,
      wherein the first conductive region is housed in a trench extending from a front face of a semiconductor substrate into the semiconductor substrate, and
      wherein the dielectric layer rests on the front face of the semiconductor substrate and the second conductive region rests on the dielectric layer.

2. The device according to claim 1, wherein said stack is located facing a portion of a width of said trench housing the first conductive region on said front face.

3. The device according to claim 1, wherein pairs of elementary capacitive elements in the series connection are connected, alternately, by the second conductive region that is common to two consecutive elementary capacitive elements and by the first conductive region that is common to two consecutive elementary capacitive elements.

4. The device according to claim 1, wherein the semiconductor substrate comprises an electrical isolation region extending vertically into the semiconductor substrate from the first face, wherein said trench housing the first conductive region of each elementary capacitive element passes through the electrical isolation region.

5. The device according to claim 1, further comprising:
   a semiconductor well that is housed in the semiconductor substrate where said series connected plurality of elementary capacitive elements are located;
   a first contact and a second contact which are electrically connected by an electrical path through the semiconductor well comprising a section that is located between a bottom of the trench and a bottom of the semiconductor well; and
   a detection circuit configured to detect an electrical discontinuity in the semiconductor well between the first contact and the second contact.

6. The device according to claim 1, further comprising a comparator having an input coupled to said at least one node of the series connected plurality of elementary capacitive elements, said comparator configured to compare the physical quantity at said at least one node to a threshold.

7. The device according to claim 6, wherein an output from the comparator is a binary value indicative of said duration.

8. The device according to claim 1, wherein a pair of elementary capacitive elements in the series connection is connected by one second conductive region that is common to the elementary capacitive elements of said pair.

9. The device according to claim 1, wherein a pair of elementary capacitive elements in the series connection is connected by one first conductive region that is common to the elementary capacitive elements of said pair.

10. The device according to claim 1, wherein said at least one node of the series connected plurality of elementary capacitive elements comprises a first node and a second node, and further comprising:
   a first comparator having an input coupled to said first node, said first comparator configured to compare the physical quantity at said first node to a first threshold; and
   a second comparator having an input coupled to said second node, said second comparator configured to compare the physical quantity at said second node to a second threshold.

11. The device according to claim 10, wherein outputs from the first and second comparator provide a binary word indicative of said duration.

* * * * *